(12) United States Patent
Ikeda et al.

(10) Patent No.: US 7,996,802 B2
(45) Date of Patent: Aug. 9, 2011

(54) METHOD OF VERIFYING CIRCUIT AND COMPUTER-READABLE STORAGE MEDIUM FOR STORING COMPUTER PROGRAM

(75) Inventors: Noriyuki Ikeda, Kawasaki (JP); Takashi Matsuura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 485 days.

(21) Appl. No.: 12/230,387

(22) Filed: Aug. 28, 2008

(65) Prior Publication Data

US 2009/0064065 A1 Mar. 5, 2009

(30) Foreign Application Priority Data

Aug. 30, 2007 (JP) ................. 2007-224750

(51) Int. Cl.
*G06F 17/50* (2006.01)
*G06F 9/455* (2006.01)
(52) U.S. Cl. .................. 716/106; 716/107; 716/111
(58) Field of Classification Search .................. 716/106, 716/107, 111
See application file for complete search history.

(56) References Cited

U.S. PATENT DOCUMENTS

| | | | | |
|---|---|---|---|---|
| 5,469,367 | A * | 11/1995 | Puri et al. ...................... | 716/104 |
| 6,088,821 | A * | 7/2000 | Moriguchi et al. ........... | 714/724 |
| 6,170,072 | B1 | 1/2001 | Moriguchi et al. | |
| 6,557,161 | B2 * | 4/2003 | Jones ............................. | 716/117 |
| 2002/0188912 | A1 * | 12/2002 | Kondratyev ..................... | 716/2 |
| 2006/0190851 | A1 * | 8/2006 | Karaki et al. ..................... | 716/3 |
| 2007/0040586 | A1 * | 2/2007 | Sakamaki et al. .............. | 327/19 |
| 2009/0106719 | A1 * | 4/2009 | Stevens ............................. | 716/6 |
| 2010/0316142 | A1 * | 12/2010 | Tsuchiya et al. .............. | 375/259 |

FOREIGN PATENT DOCUMENTS

JP 2000-11031 1/2000

OTHER PUBLICATIONS

Morin-Allory, K, et al. "Asynchronous Assertion Monitors for Multi-Clock Domain System Verification", Seventeenth IEEE International Workshop on Rapid System Prototyping, Jun. 2006, pp. 223-228.*
Chong, K et al. "A Simple Methodology of Designing Asynchronous Circuits using Commercial Design Tools and Standard Library Cells", ISIC 2007, International Symposium on Digital Object Identifier, Sep. 2007, pp. 176-179.*
Nelson, C.A., et al. "Efficient Verification of Hazard-Freedom in Gate-Level Timed Asynchronous Circuits", IEEE Transactions on Computer-Aided Design of Integrated Circuits, Mar. 2007, pp. 592-605.*
Yavuz-kahveci, T., et al. "Verificationof Parameterized Hierarchical State Machines using Action Language Verifier", Proceedings , Third ACM and IEEE International Conference on Formal Methods and Models for Co-Design, 2005, pp. 79-88.*

* cited by examiner

*Primary Examiner* — Stacy A Whitmore
*Assistant Examiner* — Magid Y Dimyan
(74) *Attorney, Agent, or Firm* — Staas & Halsey LLP

(57) ABSTRACT

A method of verifying a circuit for use in an apparatus for verifying a circuit operation indicated by circuit information, the circuit including a plurality of logic circuits and at least one connection line between the logic circuits, the method includes: obtaining information of a plurality of pieces of asynchronous circuits from the circuit information; determining information of asynchronous circuits of a first type and a second type stored in a library; extracting information of an asynchronous circuit of a third type including the asynchronous circuits of the first type and the second type; and extracting verification information associated with the information of the asynchronous circuit of the third type, for verifying the circuit.

14 Claims, 15 Drawing Sheets

FIG.10

```
property sync_chk_001 = always( ( [rose(STB_CDC)
             |-> { ((STB_CDC && !STB_SYNC && !RDY_PRE && !RDY_CDC) [*..2]};
                   (STB_CDC && STB_SYNC && !RDY_PRE && !RDY_CDC);
                   (STB_CDC && STB_SYNC && RDY_PRE && !RDY_CDC);
                   (STB_CDC && STB_SYNC && RDY_PRE && RDY_CDC);
                 }
             abort !RST_B ) @posedge(CLK_B);

property sync_chk_002 = always( ( [rose(RDY_CDC)
             |-> { ((RDY_CDC && !RDY_SYNC && STB_PRE && STB_CDC) [*..2]};
                   (RDY_CDC && RDY_SYNC && STB_PRE && STB_CDC);
                   (RDY_CDC && RDY_SYNC && !STB_PRE && STB_CDC);
                   (RDY_CDC && RDY_SYNC && !STB_PRE && !STB_CDC);
                 }
             abort !RST_A ) @posedge(CLK_A);
```

105

FIG.14
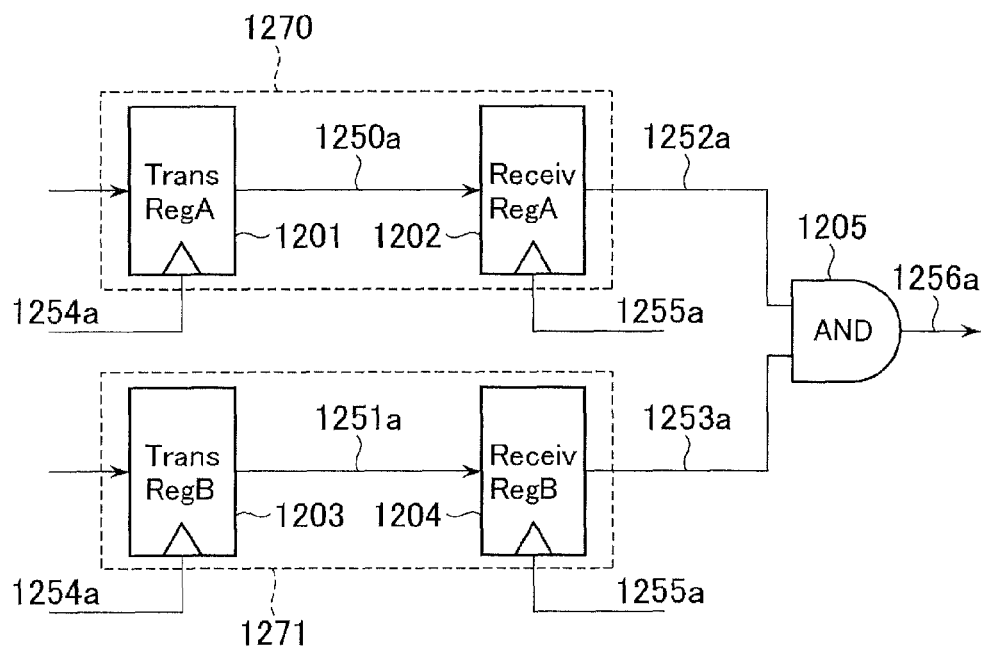
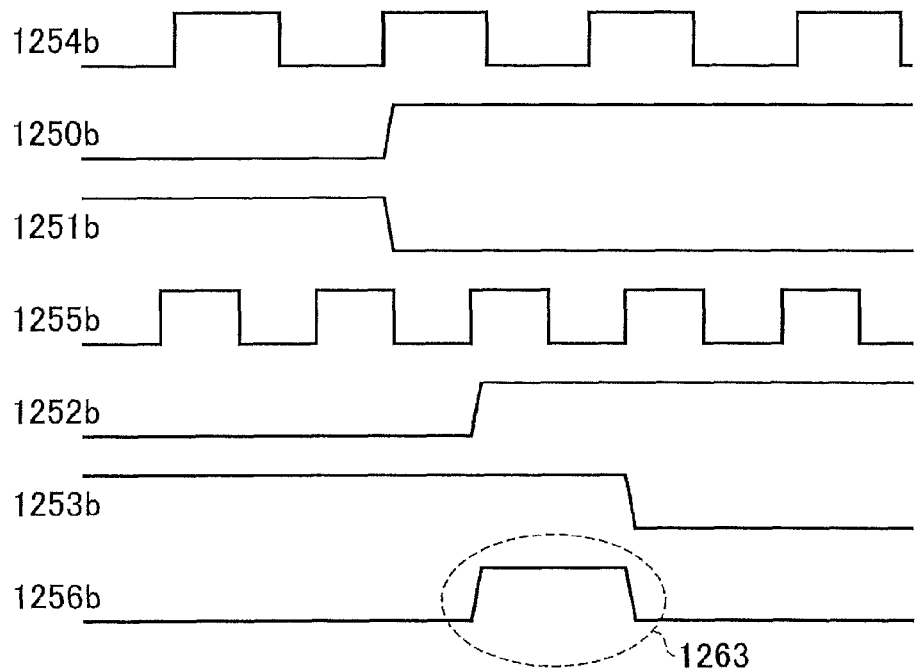

METHOD OF VERIFYING CIRCUIT AND COMPUTER-READABLE STORAGE MEDIUM FOR STORING COMPUTER PROGRAM

CROSS-REFERENCE TO RELATED APPLICATION

This application is based upon and claims the benefit of priority of the prior Japanese Patent Application No. 2007-224750 filed on Aug. 30, 2007, the entire contents of which-are incorporated herein by reference.

BACKGROUND

1. Field

This art is related to a method of verifying the operation of a circuit using circuit connection information about connection between logic circuits.

2. Description of the Related Art

When designing a semiconductor integrated circuit, a designer designs a circuit and performs logic synthesis in order to verify whether a problematic portion of the circuit operation is present. Recently, some highly advanced semiconductor integrated circuits have included asynchronous circuits that operate with different clocks in the transmission side and the reception side. In such asynchronous circuits, a phenomenon that is specific to asynchronous circuits occurs (e.g., a metastable state). Since this phenomenon may cause a fault, it is important to verify the asynchronous circuits in the design phase. As used herein, the term "metastable state" refers to a state in which an output level of a signal reception register becomes unstable in accordance with the reception timing of a signal reception register driven with a clock different from that of a signal transmission register.

FIG. 3 of Japanese Patent Application Laid-open No. 2000-11031 describes a method for extracting a cell for which timing verification is needed when designing a semiconductor integrated circuit. More specifically, when a clock of a signal transmission register is different from a clock of a signal reception register, the registers are extracted as cells for which timing verification is needed.

However, for example, in the existing technology described in Japanese Patent Application Laid-open No. 2000-11031, an effect of transmission and reception timing of a signal propagating in an asynchronous path on transmission and reception timing of a signal propagating in another asynchronous path may not be extracted. Accordingly, if an error is detected during circuit verification (e.g., timing verification), the designer manually needs to determine whether the cell itself is problematic, an asynchronous path between cells is problematic, or signal propagation timing between asynchronous paths is problematic.

SUMMARY OF THE INVENTION

According to an aspect of an embodiment, a method of verifying a circuit for use in an apparatus for verifying a circuit operation indicated by circuit information, the circuit including a plurality of logic circuits and at least one connection line between the logic circuits, the method includes: obtaining information of a plurality of asynchronous circuits from the circuit information; determining information of asynchronous circuits of a first type and a second type stored in a library; extracting information of an asynchronous circuit of a third type including the asynchronous circuits of the first type and the second type; and extracting verification information associated with the information of the asynchronous circuit of the third type, for verifying the circuit.

Additional objects and advantages of the invention will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

FIG. 10 illustrates an example of assertion information registered with the library;

FIG. 14 illustrates a problem caused by a metastable state of an asynchronous circuit.

DESCRIPTION OF THE PREFERRED EMBODIMENTS

Embodiments will be described below. The present invention is not limited to the following embodiments.

Figure 1:
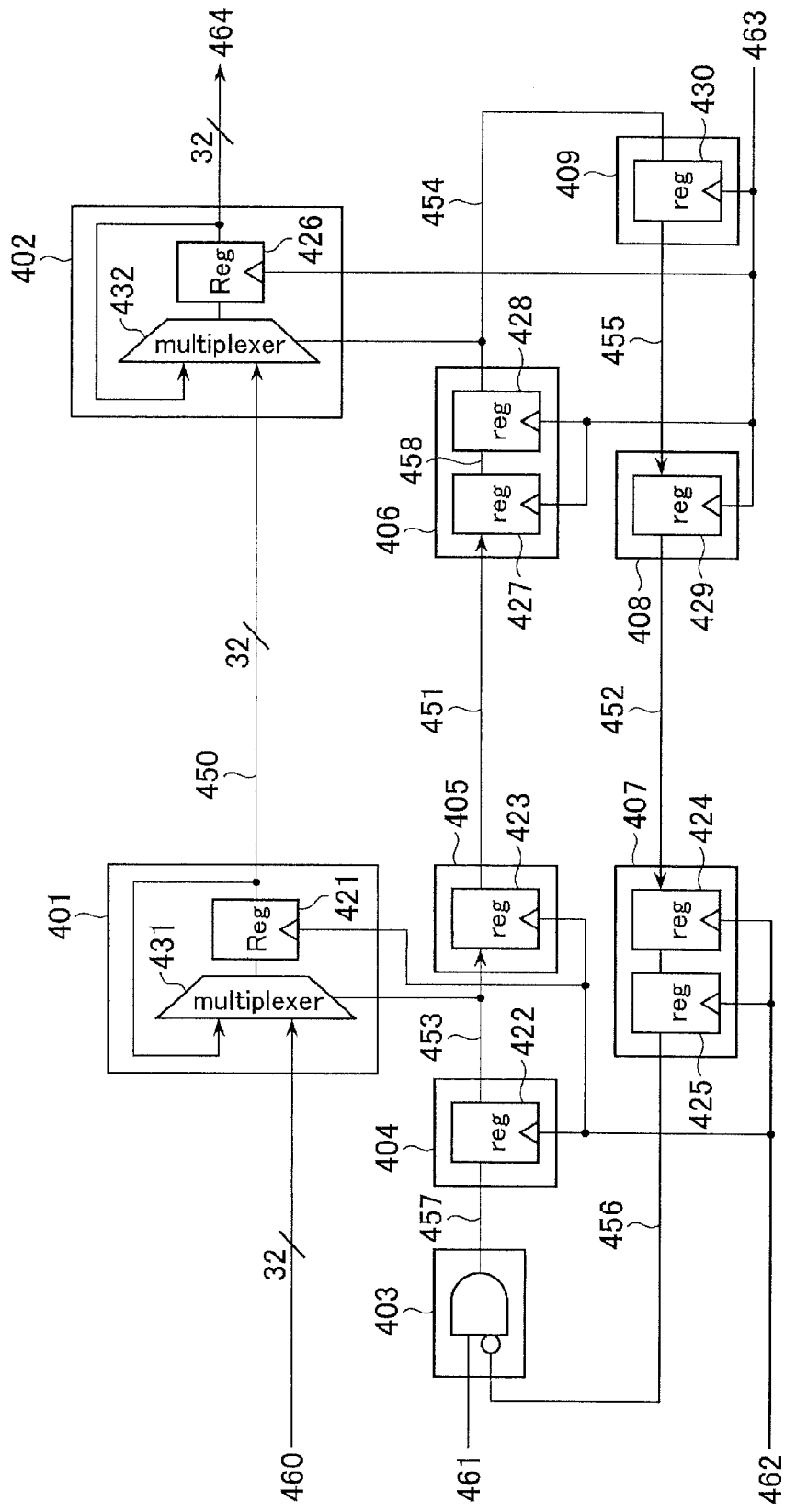
FIG. 1 illustrates an example asynchronous circuit that is an asynchronous verification target.

FIG. 1 illustrates an exemplary asynchronous circuit that is a verification target and that is extracted from a given circuit. In the present embodiment, asynchronous paths are searched for in design information about the asynchronous circuit, and timing information between the asynchronous paths is output as verification information. The present exemplary embodiment is schematically described next with reference to FIG. 1. Reference numerals 421 to 430 represent registers. As used herein, the term "register" refers to a circuit that outputs an input signal in synchronization with a clock. Reference numerals 431 and 432 represent selectors. Reference numerals 401 to 409 represent circuits to be compared with those in a library described below. Reference numerals 450 to 458 represent connection lines. Signals 460 and 461 are input signals. The signals 460 and 461 are synchronized with a clock signal 462. A signal 464 Is an output signal. The signal 462 and a signal 463 are asynchronous clock signals having different cycles or different phases. As for registers connected to a transmission end and a reception end of the connection line 450, the register 421 connected to the transmission end is synchronized with the clock signal 462. In contrast, the register 426 connected to the reception end is synchronized with the clock signal 463. In this way, by examining clock information supplied to the registers connected to the transmission and reception ends of the connection line 450, the connection line 450 having the registers to which different clocks are supplied can be detected as an asynchronous connection line. Similarly, the connection lines 451 and 452 can be detected as asynchronous connection lines.

In a circuit illustrated in FIG. 1, the asynchronous connection lines are closely related to each other. For example, a logic circuit 406 connected to a reception end of the asynchronous connection line 451 controls output timing of the signal 464 output from a logic circuit 402 connected to the reception end of the asynchronous connection line 450. By outputting verification information, such as timing verification conditions, on the basis of a relationship between the asynchronous connection lines, the accuracy of the verification of an asynchronous circuit can be increased.

Figure 2:
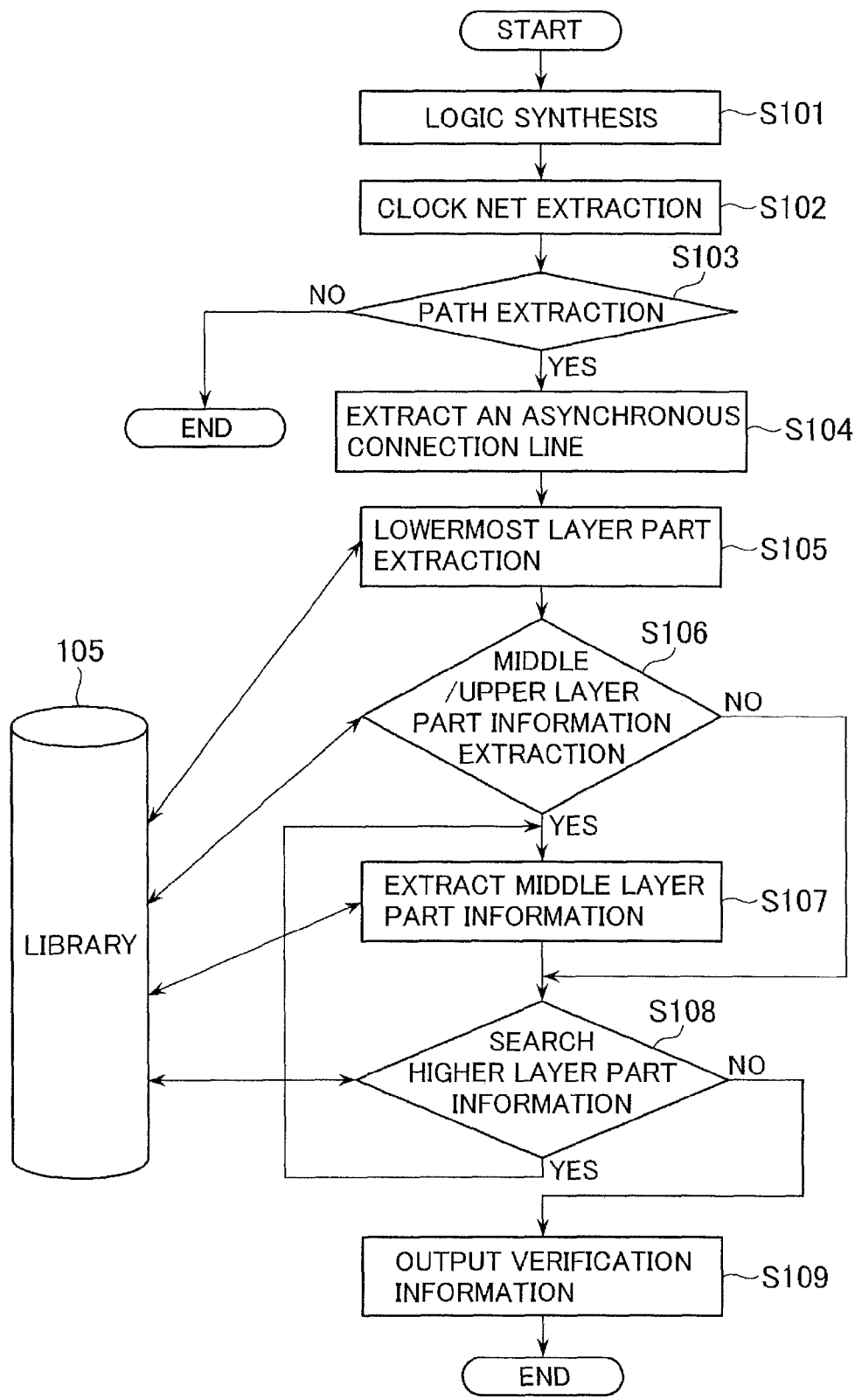
FIG. 2 is a flow chart of an asynchronous verification method.

FIG. 2 is a flow chart of an asynchronous verification method. The flow from extraction of related asynchronous connection lines to output of verification information between the asynchronous connection lines is described with reference to the flow chart shown in FIG. 2. These processes are performed by a central processing unit (CPU) 1003. In logic synthesis step S101 of FIG. 2, the CPU 1003 performs logic synthesis on the basis of circuit design information written in a register transfer level (RTL) and outputs circuit connection information including logic circuit information and connection line information. As used herein, the term "RTL" refers to a level in which a circuit is represented by registers, such as flip-flops, and combinational logic circuits. In clock net extraction step S102, the CPU 1003 extracts clock information about clocks that drive registers from the circuit connection information. In path extraction step S103, the CPU 1003 determines whether a domain crossing exists, that is, whether an connection line for which a transmission register and a reception register have different clock domains exists. If a domain crossing exists, the CPU 1003, in step S104, determines that that connection line is an asynchronous connection line and extracts the connection line. In lowermost layer part extraction step S105, the CPU 1003 searches for circuit information that is included in the circuit connection information and that matches lowermost layer part information registered in a library 105. If matched information is found, the CPU 1003 extracts the circuit information as a lowermost layer part. Here, the library 105 includes circuit part information about parts that form an asynchronous circuit together with style check information and dynamic check information registered therein in a hierarchical structure. The details of the library 105 are described below. In middle/upper layer part information extraction step S106, the CPU 1003 searches the library for middle layer part information that matches the circuit information, starting from the asynchronous connection line extracted in step S104, using the types of pieces of the lower layer part information, the connection relationship between the pieces of the lower layer part information, and the path information of the clock domain. If matched information is found, the CPU 1003, in step S107, extracts the information as middle layer part information and outputs the information as verification information. As used herein, the term "verification information" refers to information corresponding to circuit part information defined in the library 105 and used for verifying the operation of the circuit. By outputting a signal name written in the circuit connection information processed in step S101 as the verification information, the designer can easily perform verification. In step S108, the CPU 1003 further searches the library 105 for higher layer part information that matches the circuit information using the types of pieces of the middle layer part information and information about signal paths connecting the pieces of the middle layer part information. If matched information is found, the CPU 1003 extracts the information as upper layer part information in step S107 and outputs the information as verification information in step S109. In a similar manner, the CPU 1003, in step S108, searches the library to determine whether a part that matches the circuit information is present in further upper layers. If matched information is found, the CPU 1003, in step S107, outputs the information as part information. In step S109, the CPU 1003 outputs verification information. However, if matched information is not found, the part extraction process is completed. Each of the steps is included in more detail below. In this description, verification information is output each time part information is extracted in each layer. However, only verification information for the uppermost layer part information may be output.

According to this method for verifying a circuit, asynchronous circuit information and verification information between the asynchronous circuit information can be automatically extracted. Thus, the efficiency and the accuracy of verification of a logic circuit including an asynchronous circuit can be improved.

Figure 3:
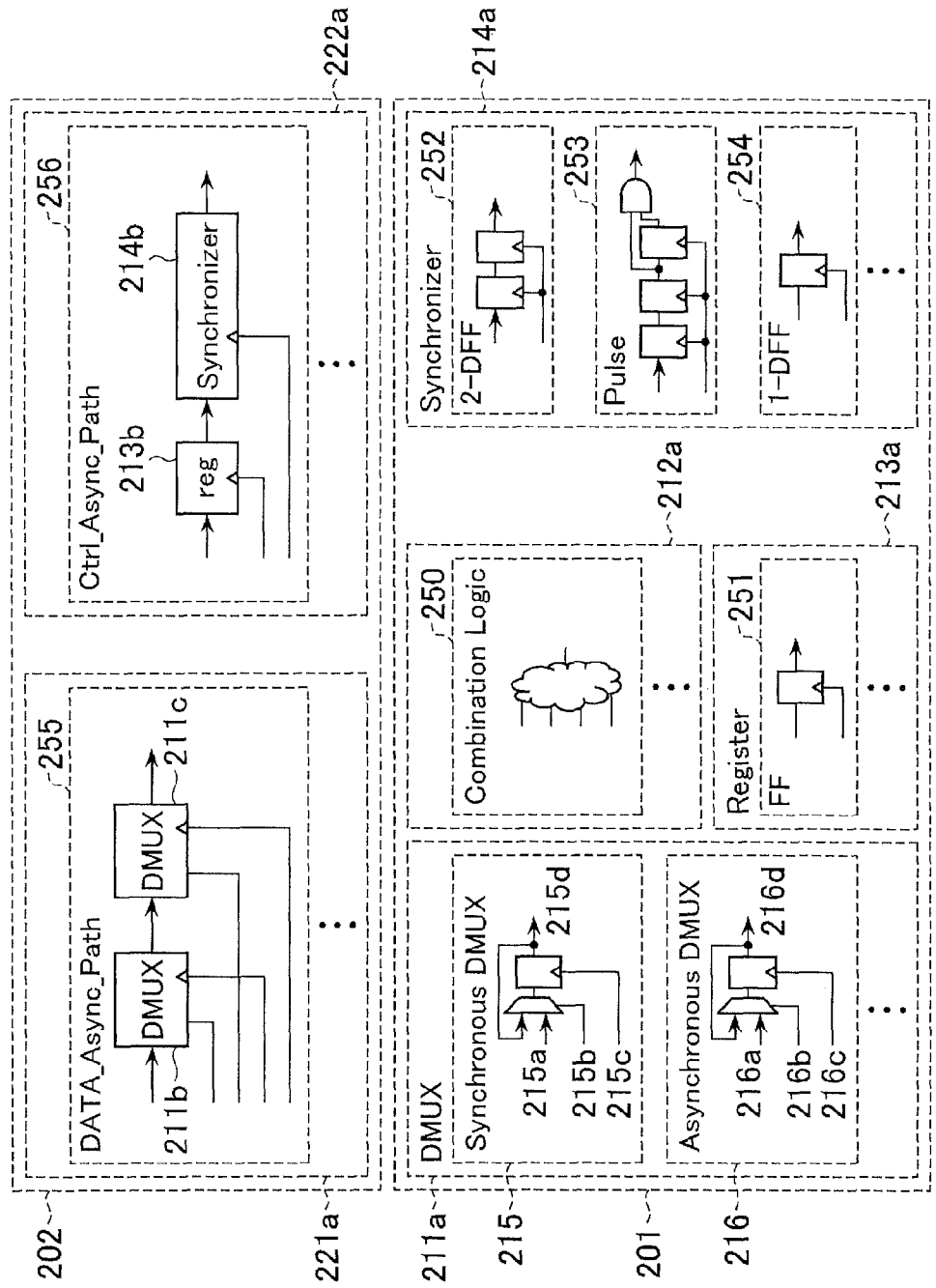
FIG. 3 is a schematic illustration of a library (a lowermost layer and a middle layer)
Figure 4:
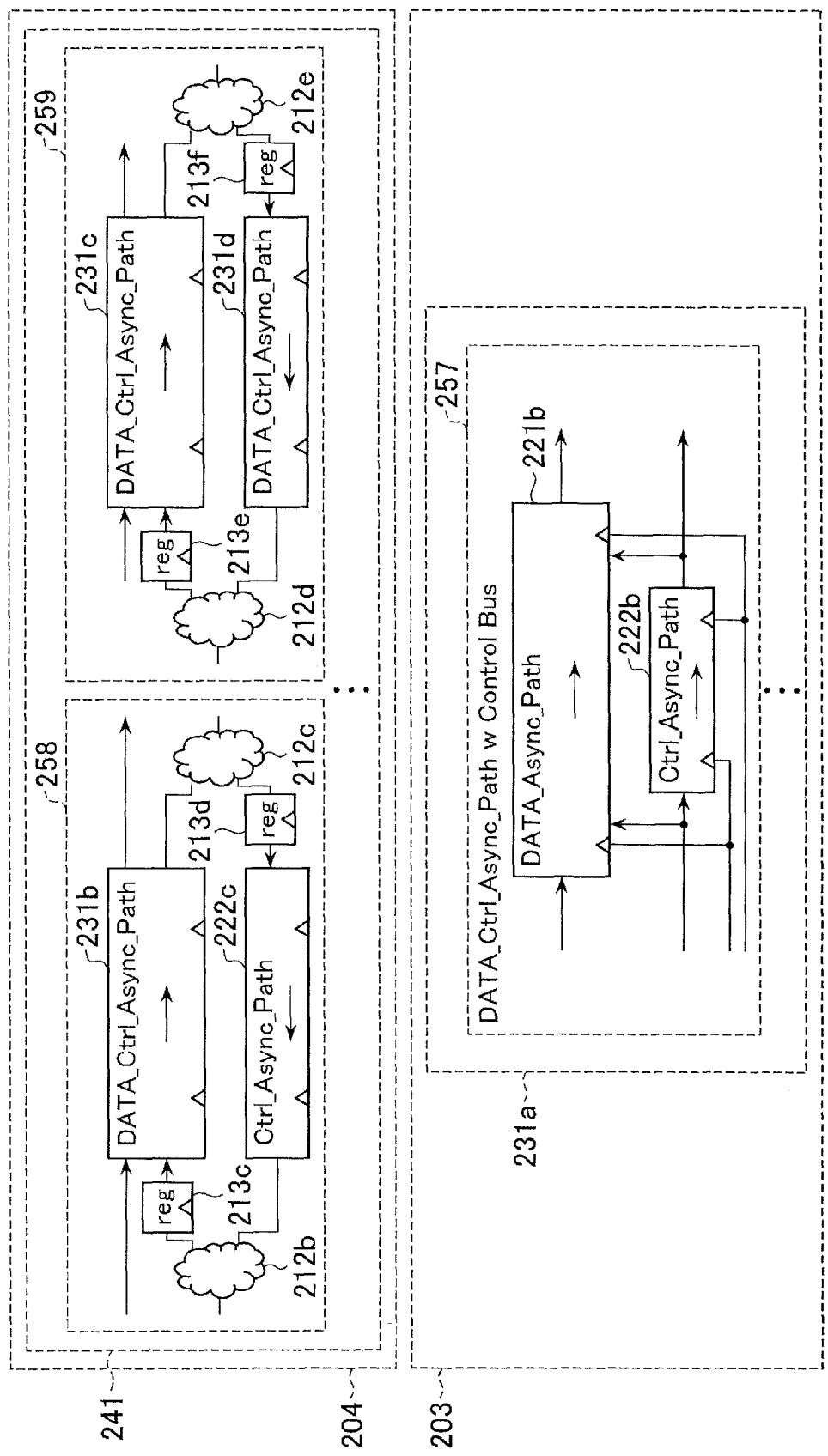
FIG. 4 is a schematic illustration of the library (an upper layer and an uppermost layer)

FIGS. 3 and 4 schematically illustrate circuit part information stored in the library 105. Circuit part information is registered in the library 105 in a hierarchical structure in accordance with the circuit scale thereof. As the layer becomes higher, the circuit scale of the circuit part information becomes larger. The details of each layer and a relationship between the layers are described next with reference to FIGS. 3 and 4.

As shown in FIG. 3, in a lowermost layer 201, a logic block including at least one logic circuit is defined as circuit part information. By using the lowermost layer 201, a minimum logic block of an asynchronous circuit can be extracted. In a middle layer 202 illustrated in FIG. 3, a combination of an asynchronous connection line and parts defined in the lowermost layer 201 and connected to either end of the asynchronous connection line is defined as circuit part information. By using the middle layer 202, a minimum component of an asynchronous circuit can be extracted.

In an upper layer 203 illustrated in FIG. 4, a combination of parts defined in the layers 201 and 202, which are below the middle layer, is defined as circuit part information. In an uppermost layer 204, a combination of parts defined in the layers 201, 202, and 203, which are below the upper layer, is defined as circuit part information. By using the upper layer 203 or the uppermost layer 204, a plurality of combinations of asynchronous circuits can be extracted.

It is desirable that a circuit configuration frequently used is registered in the library as circuit part information. Furthermore, in the library, parts having the same function but having different circuit configurations are defined in the same category. For example, in the circuit part information in the lowermost layer 201 illustrated in FIG. 3, circuit part information 215 and circuit part information 216 are registered in a multiplexer part group 211a. The circuit part information 215 indicates that an input signal 215a and a control signal 215b are input to a selector in synchronization with a clock 215c of a register, and an output signal 215d is output. In contrast, the circuit part information 216 indicates that an input signal 216a and a control signal 216b are input to a selector in synchronization with a clock that is not synchronized with a clock 216c of a register, and an output signal 216d is output. In this way, the pieces of information about circuit parts having the same circuit configuration, but having a register and a selector synchronously operating and having a register and a selector asynchronously operating are registered as parts in the same category. As the number of parts in the same category increases, the probability that a circuit is verified as matching a part in the library can be increased. Similarly, a combinational circuit 212a includes circuit part information 250 as a part group. A register 213a includes circuit part information 251 as a part group. A synchronizer 214a includes circuit part information 252 to 254 as a part group. As used herein, the term "combinational circuit" refers to a circuit including no registers and outputting a signal determined by a combination of a plurality of input logic signals. The term "register" refers to a circuit that outputs an input signal in synchronization with a clock. The term "synchronizer" refers to a circuit having at least one register connected thereto, the registers operating with the same clock in order to synchronize signals with each other.

In the middle layer 202 illustrated in FIG. 3, a data transfer asynchronous path 221a and a control transfer asynchronous path 222a are defined as circuit part information. In addition, each of circuit part information 255 and 256 is defined as a part group. As used herein, the term "data transfer asynchronous path" refers to a data signal transfer path in which a transmission register and a reception register operate in synchronization with different clocks. The term "control transfer asynchronous path" refers to a control signal transfer path in which a transmission register and a reception register operate in synchronization with different clocks. Each of multiplexers 211b and 211c, a register 213b, and a synchronizer 214b corresponds to one of the pieces of circuit part information defined in the lowermost layer 201.

As shown in FIG. 4, a control data transfer structure 231a is defined in the upper layer 203. A handshake structure 241 is defined in the uppermost layer 204. The control data transfer structure 231a includes circuit part information 257 as a part group. The handshake structure 241 includes circuit part information 258 and 259. As used herein, the term "control data transfer structure" refers to a structure in which the output of the data transfer asynchronous path is controlled using the output of the control transfer asynchronous path. The term "handshake structure" refers to a structure in which a plurality of asynchronous paths are coupled with each other using a combinational circuit. Each of a data transfer asynchronous path 221b, control transfer asynchronous paths 222b and 222c, combinational circuits 212b to 212e, registers 213c to 213f, and control data transfer structures 231b to 231d corresponds to one of the pieces of circuit part information defined in the lowermost layer 201, the middle layer 202, and the upper layer 203 below the uppermost layer 204.

Note that, in the present embodiment, the number of layers of the library is four. However, the present technique is not limited thereto. For example, the number of layers of a matching logic circuit may be further increased.

Figure 5:
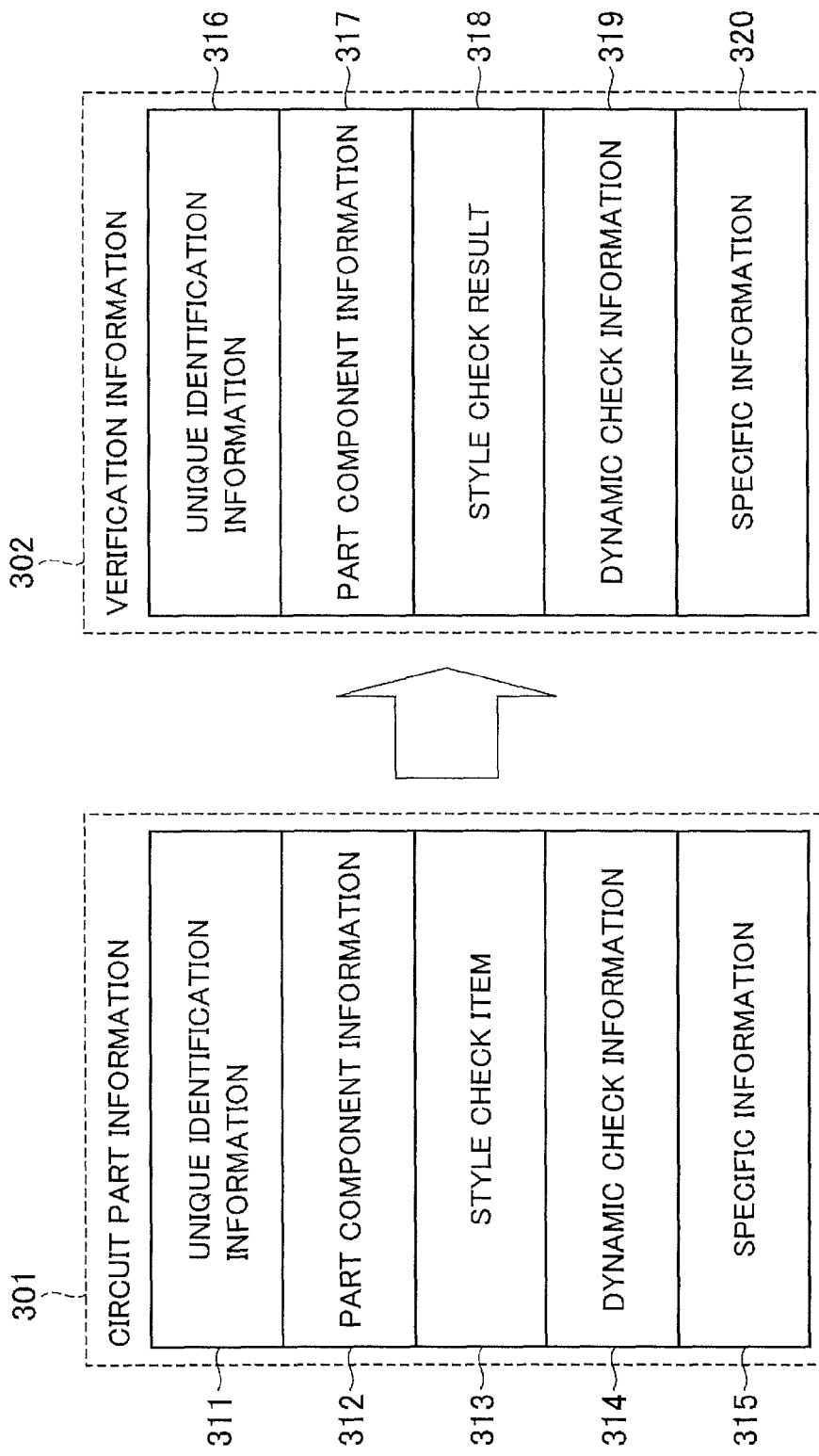
FIG. 5 illustrates a correspondence relationship between circuit part information in the library and verification information.

FIG. 5 illustrates a correspondence relationship between circuit part information 301 about each of the parts described in the library 105 shown in FIG. 2 and verification information 302 generated on the basis of the circuit part information 301. The verification information 302 is generated each time a part is detected. The verification information 302 facilitates verification of each of the parts. In FIG. 5, all of the verification information 302 relating to a part is included in one table. However, the verification information 302 may be defined using a plurality of tables, such as an element definition table and a connection definition table, each for one piece of part information. Unique identification information 311 and part component information 312 are defined in the circuit part information 301. Furthermore, a style check item 313, dynamic check information 314 about a part, and specific information 315 about the part are defined in the circuit part information 301. The unique identification information 311 includes a name of a category of the part and a unique name of the part. The component 312 of the part includes specific information about the lower layer part information of the part, the lower layer part information, the connection information between parts, clock domain information supplied to the part, and clock net information in the part. These pieces of information are used for extracting a part registered in the library 105 using circuit design information about a verification target.

The style check item 313 includes style requirements that the part should meet, the severity levels of the requirements, and risk information estimated when the part does not meet the requirements. The dynamic check information 314 about the part includes a timing condition of a change in an input signal that the part expects, assertion information corresponding to an operating condition of the part, and coverage information. As used herein, the term "assertion information" refers to information used for verifying whether a logic circuit is operating as desired. The term "coverage information" refers to information including a range of variations in time to be verified, such as range information about a cycle shift occurring in an asynchronous path due to a phase shift of a clock.

The signal name of a path connected to the part, the bit width of the signal, and the clock name of the signal are extracted from the circuit design information and are output into the specific information 315. Furthermore, check items that may not be determined using only the information in the part and, therefore, need to be supported by the upper layer may be defined in the specific information 315.

A correspondence relationship between the circuit part information 301 and the verification information 302 is as follows. Circuit information to be searched is selected from a circuit after logic synthesis is performed. Thereafter, the circuit information is compared with the part component information 312. If circuit part information having the same circuit configuration as that of the searched target is found in the library, the verification information 302 is output on the basis of the circuit part information 301 for the part. The correspondence between the style check item 313 and a style check result 318 is as follows. When the verification information 302 is output, verification is performed on the basis of the style check item 313. Thereafter, the style check result 318 is output into the verification information 302. Thus, style checking is performed for each of the parts of the asynchronous circuit, and the results can be managed for each of the parts. In addition, specific information 320 of the part refers to circuit design information to be verified and outputs necessary pieces of information on the basis of the specific information 315 defined in the circuit part information 301.

Figure 6:
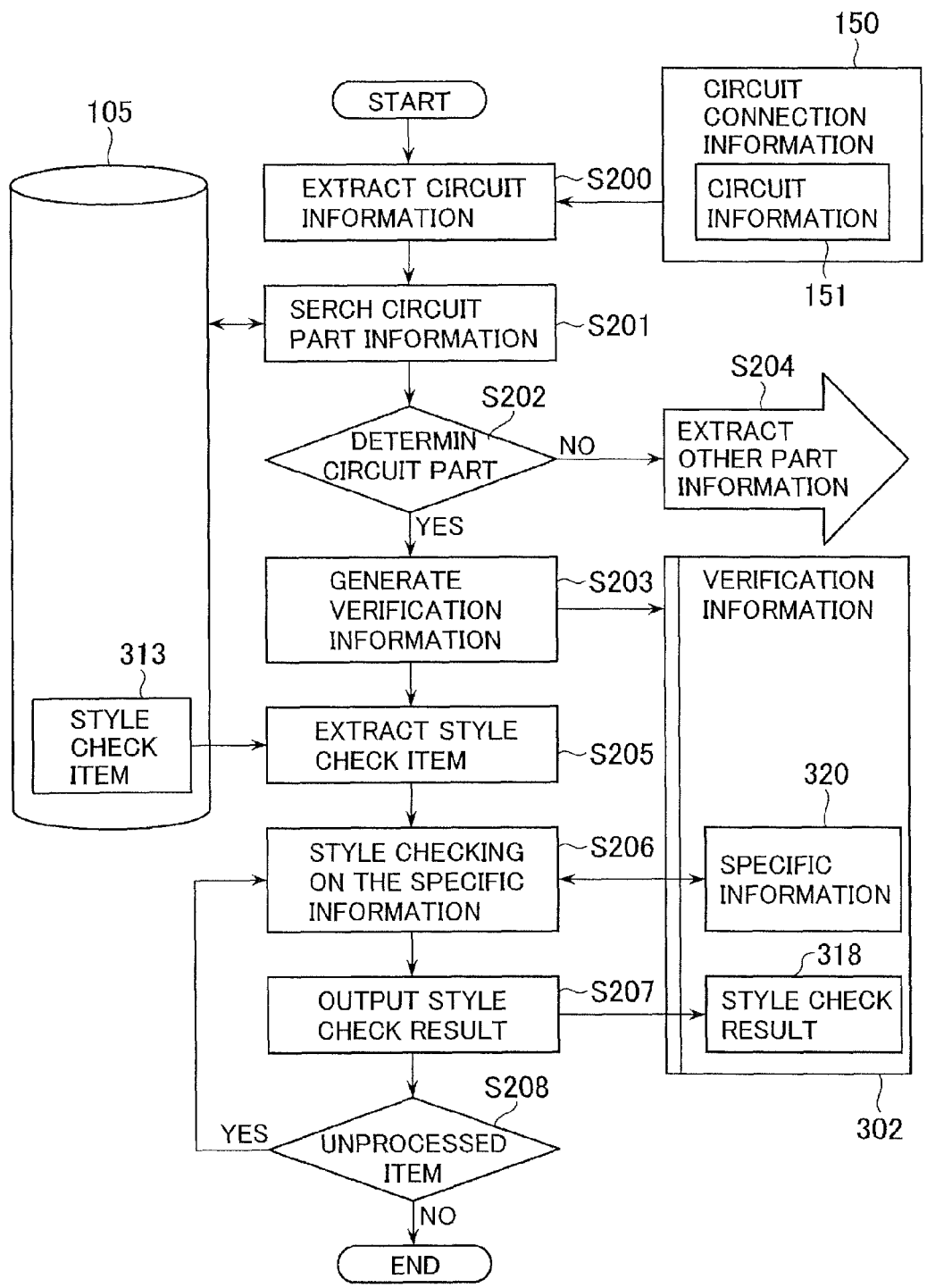
FIG. 6 is a flow chart from extraction of circuit part information to output of verification information.

FIG. 6 is a detailed flow chart of a style check process in the processing starting from detection of circuit part information to output of verification information. The flow chart shown in FIG. 6 corresponds to the part extraction step in step S105 or S107 of the flow chart shown in FIG. 2. In step S200, the CPU 1003 described in more detail below extracts given circuit information 151 from circuit connection information 150. In step S201, the CPU 1003 searches the library 105 in order to determine whether the same circuit part information is registered in the library 105. If, in step S202, the CPU 1003 determines that the same circuit part information exists, the CPU 1003, in step S203, extracts the specific information 320 from actual circuit information on the basis of the definitions in the circuit part information and generates the verification information 302. However, if, in step S202, the CPU 1003 determines that the same circuit part information does not exist in the library 105, the CPU 1003, in step S204, extracts other circuit information of circuit connection information. In step S201, the CPU 1003 searches the library again. Subsequently, in step S205, the CPU 1003 extracts the style check item 313 defined in the circuit part information in the library 105. In step S206, the CPU 1003 performs style checking on the specific information 320 written in the verification information 302 generated in step S203. The style check item 313 includes the severity of each of the items. After the style checking is performed in step S206, if the part is designed in accordance with the definitions of the library, the CPU 1003, in step S207, outputs a message indicating that information as the style check result 318. However, if the part is not designed in accordance with the definitions of the library, the CPU 1003, in step S207, outputs a message indicating that information as the style check result 318 together with the severity level of the check item. By outputting the severity level of the check item together with a message, a designer can be informed of the risk level of a design that does not meet the requirements of the check item. In step S208, the CPU 1003 determines whether an unprocessed check item is present. If an unprocessed check item is present, the CPU 1003 performs the process in step S206 again. However, an unprocessed check item is not present, the CPU 1003 completes the processing.

An example of processing of the flow chart shown in FIG. 6 is described next with reference to the circuit information 401 shown in FIG. 1. The circuit information 401 includes the selector 431 and the register 421. A part indicated by the circuit part information having the same configuration is defined in the lowermost layer 201 shown in FIG. 3 as the multiplexer 215. Accordingly, the CPU 1003 assigns a part name "DMUX" to the circuit information 401 and outputs the verification information 302 on the basis of the circuit part information. As shown in FIG. 5, information items of the verification information 302 to be output are defined for each of pieces of the circuit part information. Therefore, the specific information 320 extracted from the actual circuit on the basis of the circuit part information 301 is output as the verification information 302. The above-described processing for outputting the verification information 302 is performed by verification information extracting means 1003c shown in FIG. 12 described below. For example, the following information items are output as verification information items of the extracted circuit information 401:

part type category: multiplexer
part name: DMUX
register clock: clock 462
select input signal: connection-line-453 propagation signal
select signal bit width: 1
select signal synchronization clock: clock 462
data input signal: signal 460
data input signal bit width: 32
data input signal synchronization clock: clock 462
data output signal: connection-line-450 propagation signal
data output signal bit width: 32
data output signal synchronization clock: clock 462

Furthermore, when outputting the verification information, the CPU 1003 extracts the style check item 313 of the circuit part information 215 shown in FIG. 3 and performs style checking on the basis of the actual circuit information 401. The CPU 1003 then outputs the style check result 318 as the verification information 302. For example, if the style check item 313 of the circuit part information 215 defined in the library indicates that a data input signal is synchronized with a clock of a register, the CPU 1003 compares a clock supplied to a register that generates the data input signal with a clock supplied to a register of the circuit information to be verified. If the two clocks are the same, the CPU 1003 writes the result into the verification information 302 as the style check result 318. Furthermore, the CPU 1003 outputs, into the verification information 302, information indicating that the circuit information 401 has passed the verification.

In addition, the CPU 1003 verifies the circuit information (the logic circuit) 402 and detects that the data input signal is synchronized with the clock signal 462 and that the register 426 is synchronized with the clock signal 463. Accordingly, the CPU 1003 outputs information indicating that the clock of the logic circuit 402 is different from the clock of the circuit information 401 as the style check result 318 and the verification information 302. Furthermore, the CPU 1003 outputs, as the verification information 302, information indicating that the severity level in the verification result is a level that requires designer's confirmation. In this way, the designer easily monitors the verification result of the logic circuit of the asynchronous circuit, and therefore, the efficiency of verification can be improved.

The logic indicated by the circuit part information (the multiplexer group) 211a is that a data input signal is output in synchronization with a register clock only for a period of time in which an input signal to a selector is effective. For example, if information indicating that a data input signal is not changed for a period of time in which a select input signal is effective is defined in the circuit part information (a multiplexer) 211a as a dynamic check item of the circuit information, that information is written in the verification information as dynamic check information of the asynchronous circuit.

The circuit information (the logic circuit) 406 includes two registers: a register 427 and a register 428. The asynchronous connection line (an input signal) 451 of the register 427 is output from a register 423. The operating clocks of the register 423 and the register 427 are different. Accordingly, the circuit information 406 is extracted as lowermost-layer circuit part information 214 in the library shown in FIG. 3. As in the case of the circuit information 401, the verification information 302 is output. For example, the following items are output as the verification information of the circuit information 401:

part type category: synchronizer
part name: 2-DFF
register clock: clock 463
input signal: connection-line-451 propagation signal
input signal bit width: 1
input signal synchronization clock: clock 462
output signal: connection-line-454 propagation signal
output signal bit width: 1
output signal synchronization clock: clock 462

In addition, by registering information indicating that a combinational circuit is not present between two registers and that an connection line between the two registers has no branch as a style check item of the circuit part information (the synchronizer) 214a, the CPU 1003 can output the verification result into the verification information as a style check result. In addition, in order for the circuit information 406 to operate as a synchronizer, a signal input from the asynchronous connection line 451 needs to be effective for at least two successive cycles of the clock signal 463. Accordingly, the CPU 1003 acquires the assertion information from the circuit part information (synchronizer) 214a and outputs the assertion information into the verification information. In this way, the CPU 1003 can perform logic verification for the circuit information 406. Furthermore, two or three cycles of variance range are present between a signal propagating in the asynchronous connection line 451 of the circuit information 406 and a signal propagating in an connection line 454 due to metastability. Such information is also acquired from the circuit part information 214a and is output as dynamic check information of the circuit information 406.

Subsequently, extraction of circuit information 403 is described next. The circuit information 403 does not include a register. Such a part is extracted as a combinational logic on the basis of the circuit part information (combinational circuit) 212a, and the following verification information items are output:

input signal 1: signal 461
synchronization clock of the input signal 1: clock
input signal 2: connection-line-456 propagation signal
synchronization clock of the input signal 2: clock In addition, the state of generating an output signal is output as verification information on the basis of the circuit part information 212a. Similarly, verification information is output for other parts.

As described above, by outputting the style verification result and dynamic verification information for each of the pieces of circuit information into the verification information, the efficiency of a style check operation for each of the pieces of circuit information can be improved. In addition, the efficiency of verification of the asynchronous circuit can be improved, since conditions for verifying the logic and operation of the entire asynchronous circuit can be defined.

Figure 7:
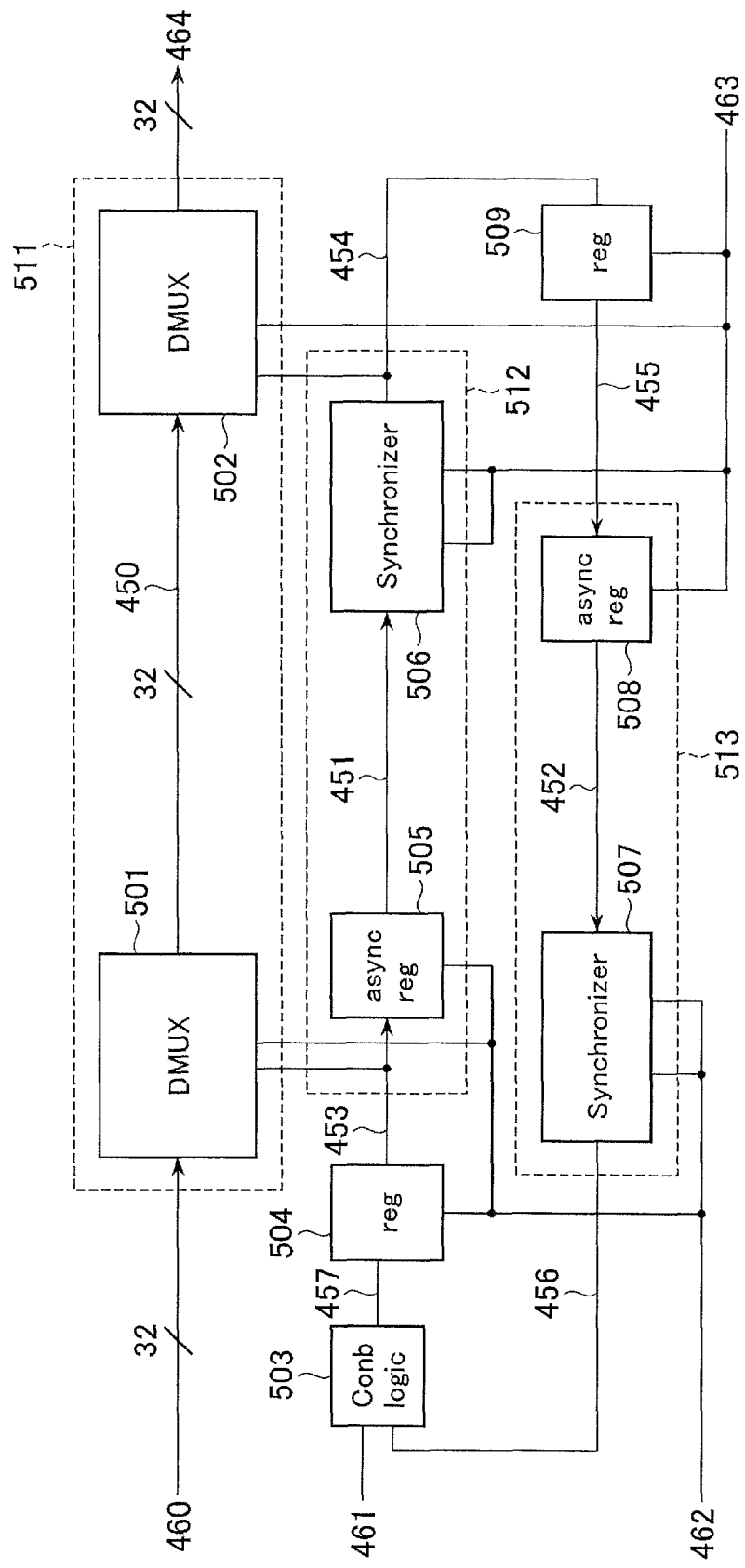
FIG. 7 illustrates the result of abstraction of asynchronous circuit by using lower-layer part information.

FIG. 7 illustrates the result of abstraction of the asynchronous circuit shown in FIG. 1 by referring to the lowermost layer library. Pieces of verification information 501 to 509 abstracted on the basis of the lowermost layer part information of the library are shown in FIG. 7. Detection of the middle layer part information is performed by searching the middle layer of the library for part information that is the same as the circuit information, starting from the asynchronous path, in accordance with the flow shown in FIG. 6 using the type of lowermost layer part information, a path between the pieces of lowermost layer part information, and path information about a clock domain (S201). The CPU 1003 compares each of the circuits shown in FIG. 7 with a part in the middle layer part information 202 in the library shown in FIG. 3 so as to detect an area (circuit information) 511 as the circuit part information 221a. The CPU 1003 assigns a name "DATA_Async_Path" to the area and outputs verification information. The CPU 1003 stores information acquired from the circuit part information 221a as verification information. In addition, the CPU 1003 outputs the coupling relationship between circuit information 501 and 502 of the circuit information 511 as verification information. The process of outputting the verification information is similar to that for the circuit information 401. For example, the following information items are output as the extracted verification information relating to the circuit information 511:

part type category: data transfer asynchronous path
part name: DATA_Async_Path
input data signal: signal 460
input data bit width: 32
input data synchronization clock: clock 462
input control signal: connection-line-453 propagation signal
input control signal bit width: 1
input control signal synchronization clock: clock 462
output data signal: signal 464
output data bit width: 32
output data synchronization clock: clock 463
output control signal: connection-line-454 propagation signal
output control signal bit width: 1
output control signal synchronization clock: clock
transmission circuit information: 501
reception circuit information: 502
asynchronous connection line: 450

Furthermore, the CPU 1003 outputs the result of verification performed in accordance with the style check items in the circuit part information 221a registered in the library as verification information. Suppose that one of the style check items of the circuit part information 221a defines that, for example, a combinational circuit is not used in a signal connection line. Although each of the transmission circuit information 501 and reception circuit information 502 includes a register, the combinational circuit includes no registers. Accordingly, if an connection line between logic circuits having registers includes, in the middle thereof, a logic circuit having no registers, the CPU 1003 determines that the logic circuit is a combinational circuit. In the present embodiment, since a combinational circuit is not present, that result is output into verification information.

Figure 8:
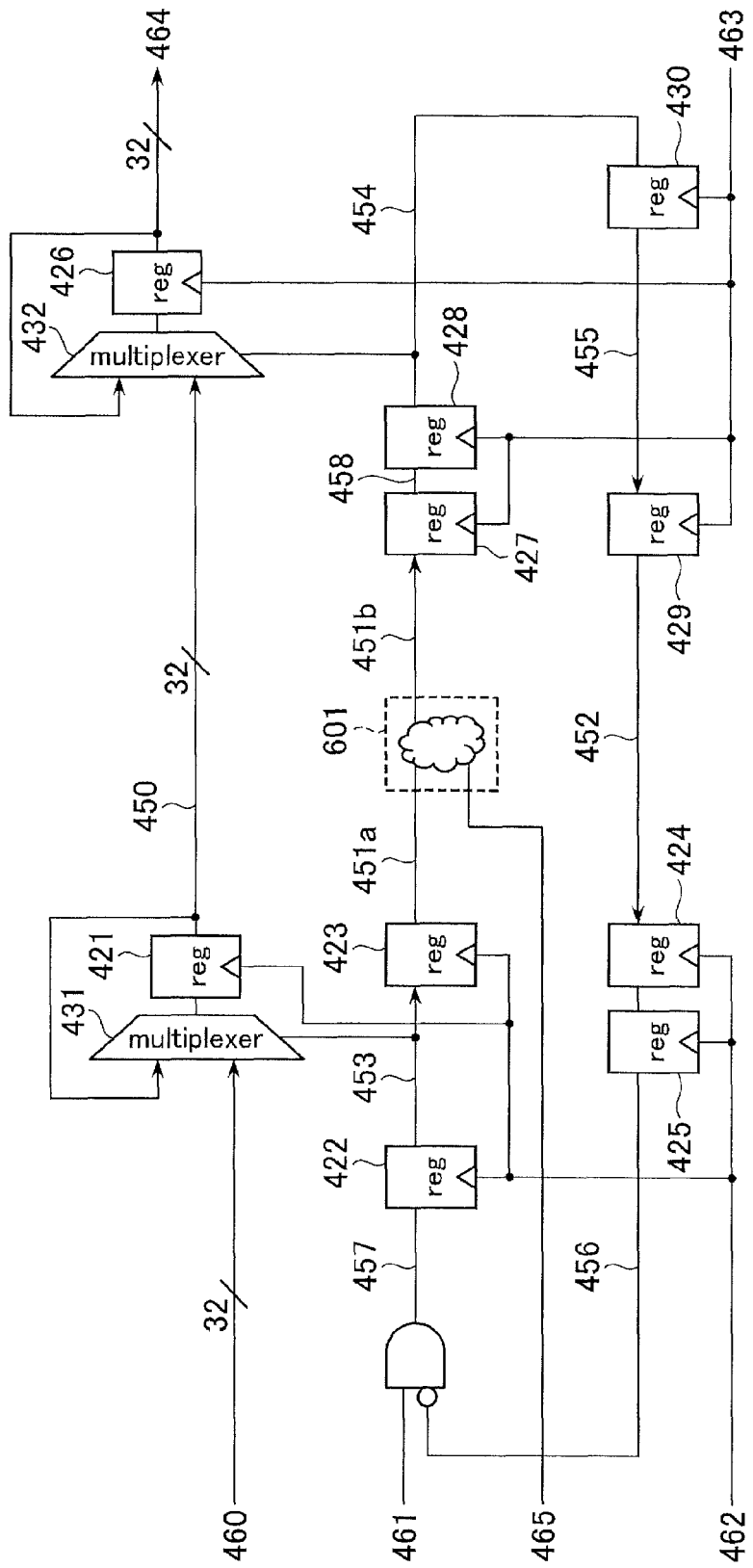
FIG. 8 illustrates an example of an asynchronous circuit in which a combinational circuit is located in an asynchronous connection path.

FIG. 8 illustrates an example of a circuit in which a combinational circuit is present in an asynchronous connection line. A combinational circuit 601 is located in a route between asynchronous connection lines 451a and 451b. The combinational circuit 601 is controlled by a control signal 465 synchronized with the clock signal 462. An output operation of verification information performed when a combinational circuit is present in an asynchronous connection line is described below with reference to FIG. 8. As shown in FIG. 8, when the combinational circuit 601 is located in a route between asynchronous connection lines 451a and 451b, the CPU 1003 outputs that information as a style check result together with the severity. Even when the combinational circuit 601 is present, the circuit operates without any problem if a change in the control signal 465 does not occur during a data transfer sequence of an connection-line-451a propagation signal. Accordingly, the severity level of the output verification information can be set to a low value. In this way, information indicating that no circuit design mistakes are found, but a combinational circuit is present can be output as verification information in order to give a warning to the designer. Thus, the efficiency of verification can be improved.

Referring back to FIG. 7, suppose that, as dynamic check information about the circuit part information 221a, information indicating that a select signal of the reception circuit part information 211c is a select signal of the transmission circuit part information 211b delivered using an asynchronous control transfer part is registered in the library. In this case, that information is output as verification information of this part. This verification information is not used in the layer of this layer. However, this information is useful when, in the upper layer, the connection relationship between the part and asynchronous control transfer circuit information (an area) 512 becomes clear. Accordingly, the CPU 1003 outputs this information into verification information as specific information. The area 512 and an area 513 are extracted in the same manner.

Figure 9:
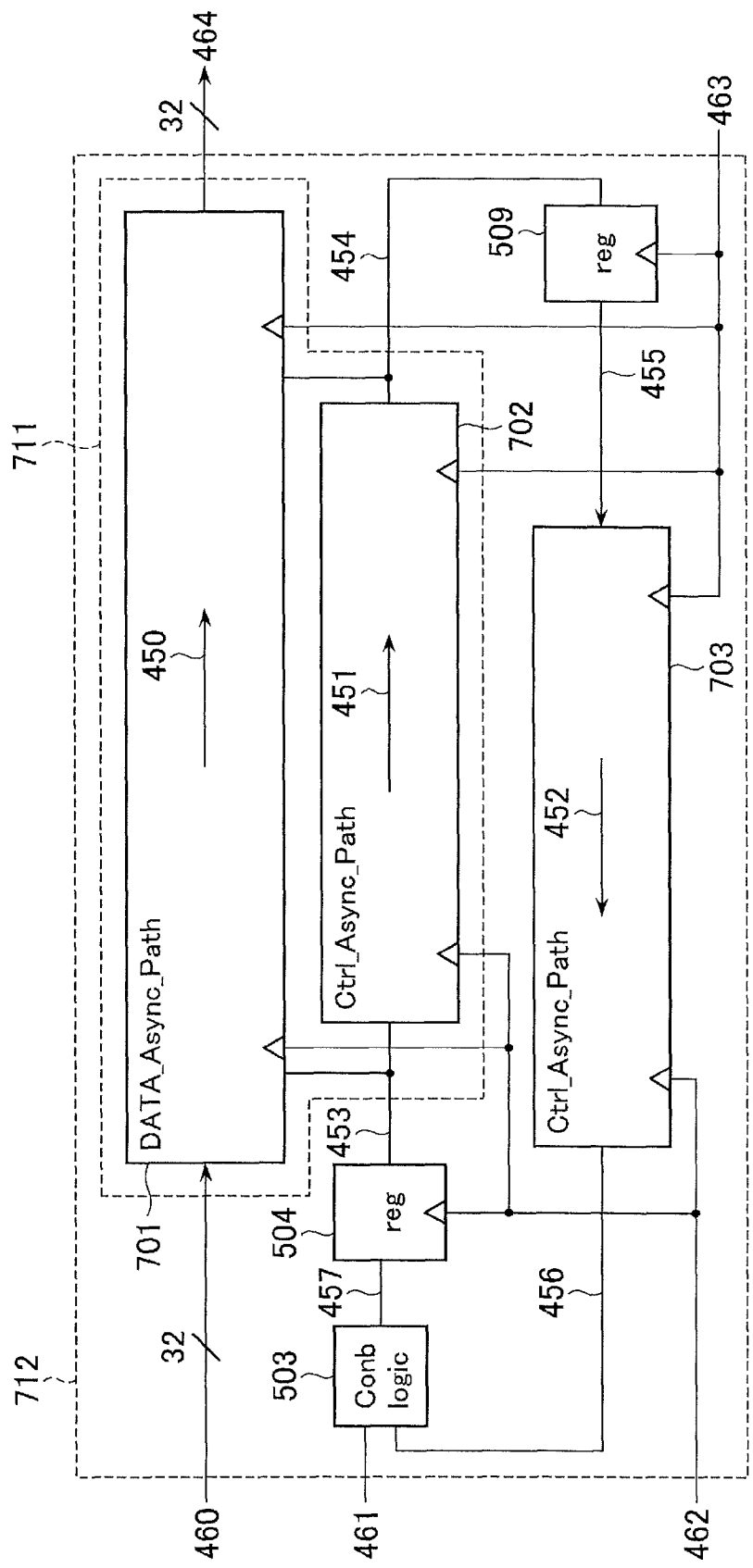
FIG. 9 illustrates the result of abstraction of an asynchronous circuit by using middle-layer part information.

FIG. 9 illustrates the result of abstraction of the asynchronous circuit shown in FIG. 7 by referring to the middle layer circuit part information shown in FIG. 3. In FIG. 9, pieces of verification information (part information) 701 to 703 are extracted on the basis of the middle layer part information of the library. Detection of the upper layer part information 203 is performed by searching for the upper layer part information 203 that matches part information in accordance with the flow shown in FIG. 2 using the type of part information, connection lines connecting parts, and clock domain information in the layers below the middle layer. The CPU 1003 examines a connection relationship between the part information 701 and the part information 702 using parameters written in the verification information. Thus, the CPU 1003 recognizes that an input control signal of the part information 701 is an input signal of the part information 702 and that an output control signal of the part information 701 is an output signal of the part information 702. In addition, since the part information 701 is asynchronous data transfer part information and the part information 702 is asynchronous control transfer part information, the CPU 1003 compares each of the part information 701 and 702 with the upper layer part information in the library shown in FIG. 4 so as to determine circuit part information that matches the circuit information shown in an area (circuit information) 711 is the circuit part information (control data transfer structure) 231*a* that is present in the upper layer of the library. The CPU 1003 assigns a name "DATA_Ctrl_Async_Path" to the detected area 711. After the corresponding circuit part information is detected in the library, the CPU 1003 outputs the verification information 302 corresponding to the description in circuit part information 231 on the basis of FIG. 5. Information acquired from the circuit part information 231 is stored in the verification information. Output processing of the verification information is similar to that for the circuit information 401. For example, the following items are stored as detected verification information about the circuit information 711:

part type category: control data transfer structure
   part name: DATA_Ctrl_Async_Path
   input data signal name: signal 460
   input data signal bit width: 32
   input data signal synchronization clock: clock 462
   input control signal name: connection-line-453 propagation signal
   input control signal bit width: 1
   input control signal synchronization clock: clock 462
   output data signal name: signal 464
   output data signal bit width: 32
   output data signal synchronization clock: clock 463
   output control signal name: connection-line-454 propagation signal
   output control signal bit width: 1
   output control signal synchronization clock: clock 463
   lower layer part information (data) 1: 701
   lower layer part information (control) 1: 702

After circuit part information in the upper layer is detected, the CPU 1003 verifies the items that are not able to be verified in the lower layers. For example, a connection relationship relating to the select signal of the circuit information 511 may not be verified in the middle layer shown in FIG. 7. However, it can be determined that an connection line 454 is connected to a part indicated by the part information 702 in the upper layer shown in FIG. 9. Accordingly, the CPU 1003 outputs this information as verification information.

In addition, the asynchronous connection lines 450 and 451 of the circuit information 711 have the same signal propagation direction. Signals propagating in the connection lines 450 and 451 are output in synchronization with the clock signal 462 with a shift of zero cycle. When these signals are asynchronously transferred to the clock signal 463, a cycle shift may occur. This variance range is generated as a cycle difference of the clock signal 463 starting from a change point of a signal propagating in the connection line 450 observed from a side of the clock signal 463 to when a signal propagating in the connection line 454 is effective. Such information is registered in the circuit part information. Upon outputting the verification information, the CPU 1003 refers to circuit part information 231*a* in the library and outputs the data into the verification information as coverage information, which is dynamic check information of circuit part information.

The search in further upper layers continues until no more upper layers are present. In FIG. 9, a signal propagating in the connection line 454 synchronized with the clock signal 463 output from the part information 702 is used for generating a signal propagating in an connection line 455 via the register 509. In addition, using the circuit information 703, this signal is subjected to asynchronous crossing to the asynchronous connection line 452 synchronized with the clock signal 462. A signal propagating in an connection line 456 is used for generating a signal propagating in an connection line 453 via circuit information 704 and 705. Since this structure is a structure in which a control signal travels back and force in an asynchronous path using circuit information for a control signal, the CPU 1003 can determine that circuit information 712 has a structure the same as the handshake structure 241 in the uppermost layer. The output processing of the verification information is performed in a similar manner to that for the circuit information 401. For example, the following items are stored as detected verification information about the circuit information 712:

part type category: handshake structure
   part name: DATA_HandShake_Part
   input data signal name: signal 460
   input data signal bit width: 32
   input data signal synchronization clock: clock 462
   input control signal name: signal 461
   input control signal bit width: 1
   input control signal synchronization clock: clock 462
   output data signal name: signal 464
   output data signal bit width: 32
   output data signal synchronization clock: clock 463
   lower layer circuit information (forward path) 1: 711
   lower layer circuit information (return path) 1: 703

If an asynchronous circuit structure is identified, the operational requirements that the asynchronous circuit structure should meet are determined. By outputting assertion information with which the operation is monitored as verification information on the basis of the circuit part information registered in the library, it can be determined whether an input for which the asynchronous circuit structure may not assure the operation in asynchronous verification, such as logic verification simulation, is received from nearby synchronous circuits. As used herein, the term "assertion information" refers to definitions of conditions that should be established between an input signal and an output signal of a logic circuit. Examples of a language for defining assertion information include PSL (Property Specification Language) and SVA (System Verilog Assertion).

FIG. 10 illustrates an example of assertion information about the circuit information 712 written using PSL, which is an assertion language. In FIG. 10, a signal STB_CDC propagates in the asynchronous connection line 451, and a signal RDY_CDC propagates in the connection line 452. In FIG. 10, assertion information about signals other than the signals STB_CDC and RDY_CDC is defined when the signals propagating in the asynchronous connection lines 451 and 452 are effective. A signal STB_SYNC propagates in the connection line 454, and a signal RDY_PRE propagates in the connection line 455. By registering such descriptions in the library, the CPU 1003 can detect corresponding asynchronous circuit part information and output the detected asynchronous circuit part information into the verification information as dynamic check information of the circuit part information. In this way, assertion information appropriate for the asynchronous circuit structure can be provided, and therefore, verification of an asynchronous circuit can be efficiently performed.

The circuit part information (handshake structure) 241 shown in FIG. 4 is a minimum unit of an asynchronous logic structure having the asynchronous operation thereof that does not affect other logic circuits. By registering information indicating that the asynchronous circuit is a minimum unit as circuit information of the circuit part information 241, the CPU 1003 can output such information as verification information. In this way, a designer can clarify the verification range of the asynchronous circuit, and therefore, the verification efficiency of a circuit can be increased.

Figure 11:
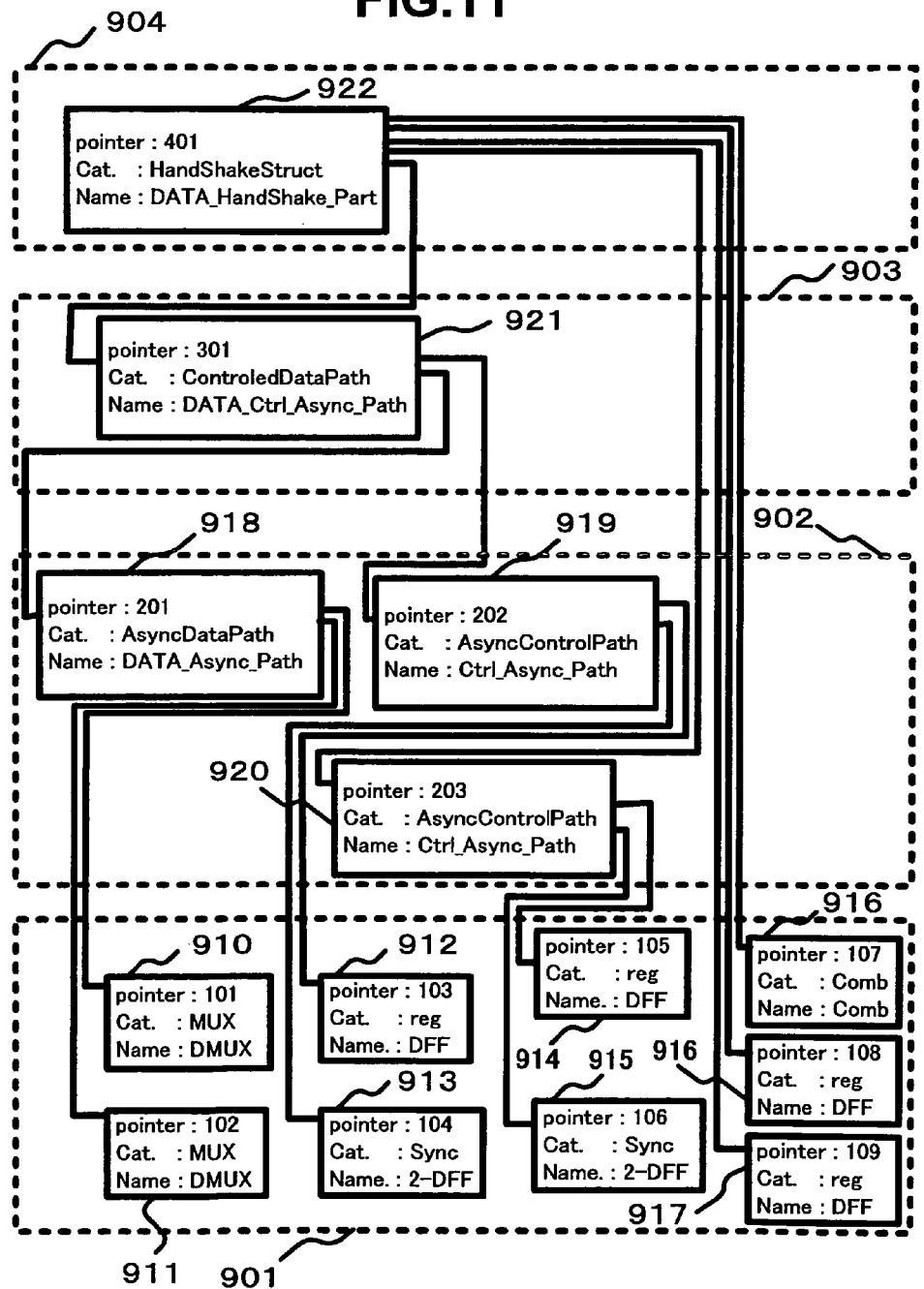
FIG. 11 illustrates a relationship between extracted pieces of verification information according to an embodiment of the present technique.

FIG. 11 illustrates a connection relationship between verification information in the layers extracted according to the present embodiment. In FIG. 11, verification information 910 to 922 located in a lowermost layer 901, a middle layer 902, an upper layer 903, and the uppermost layer 904 include their own pointers, that is, addresses corresponding to the verification information. The string "Cat." written in these pieces of verification information indicates a part type category. The string "Name" indicates a part name. Lines between these pieces of verification information indicate an address reference relationship. For example, by adding address information (pointers) about the lowermost layer part information (the verification information) 910 and 911 to a part component of the middle layer part information 918, a coupling relationship between the verification information can be clarified. As described above, by defining a coupling relationship between the verification information in the upper and lower layers in addition to circuit part information in each layer, a designer can recognize a whole structure of the asynchronous circuit, and therefore, verification of the asynchronous circuit can be efficiently performed.

Figure 12:
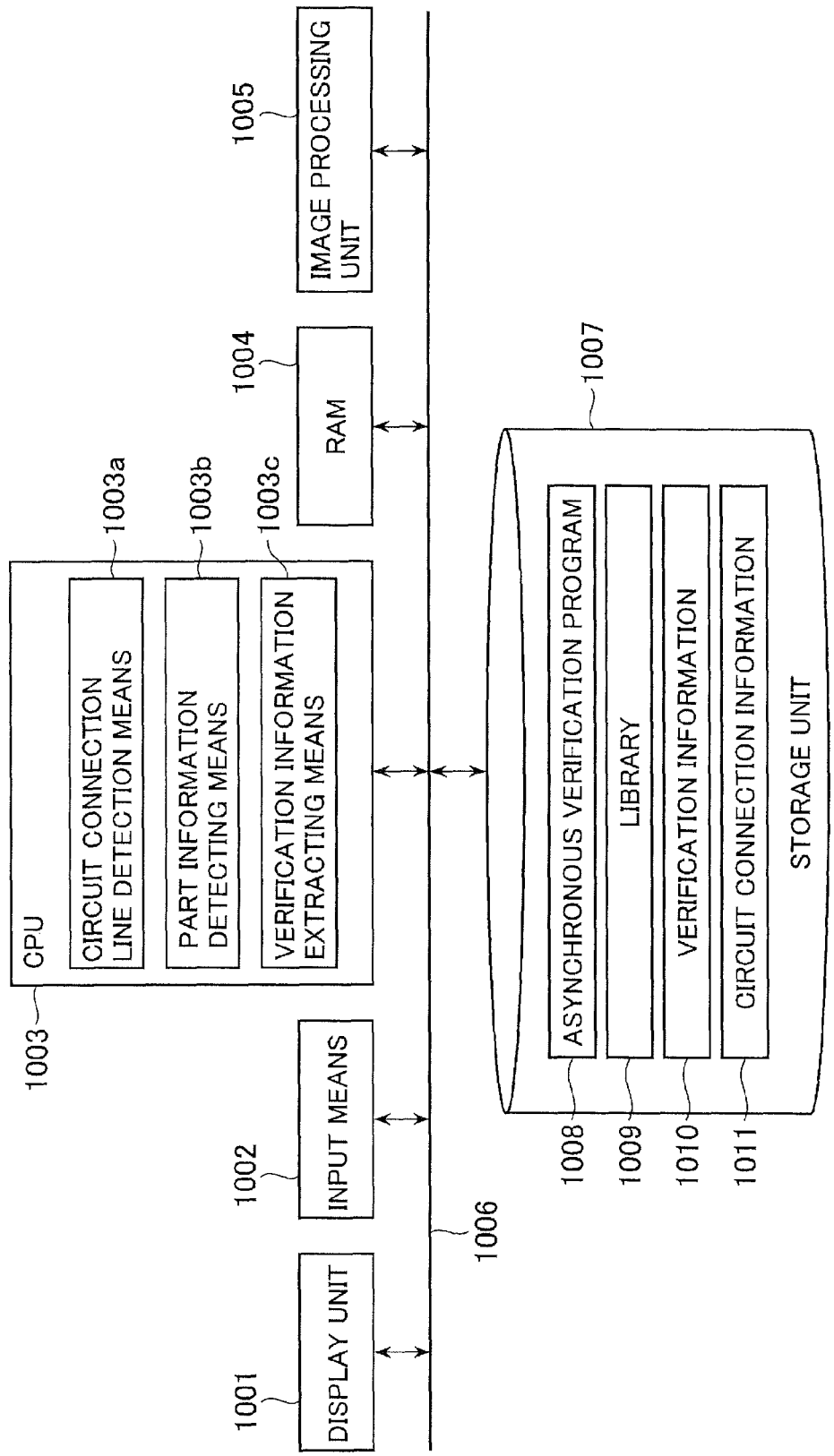
FIG. 12 illustrates an exemplary hardware configuration of a computer according to an embodiment of the present technique.

FIG. 12 illustrates an exemplary hardware configuration of a computer. A computer includes a display unit 1001, input means 1002, the CPU 1003, a random access memory (RAM) 1004, an image processing unit 1005, and a storage unit 1007. These components are connected with each other via a bus 1006. In addition, an asynchronous verification program 1008, a library 1009, verification information 1010, and circuit connection information 1011 to be verified are stored in the storage unit 1007.

By executing the asynchronous verification program 1008 on the computer having such a hardware configuration, circuit connection line detecting means 1003a, part information detecting means 1003b, and verification information extracting means 1003c are generated by the CPU 1003. The circuit connection line detecting means 1003a executes the process in step S104 shown in FIG. 2. The part information detecting means 1003b and the verification information extracting means 1003c execute the processes in steps S105 and S107 shown in FIG. 2.

The asynchronous verification program 1008 that describes the details of processing can be recorded in a computer-readable recording medium. Examples of the computer-readable recording medium include a magnetic recording unit, an optical disk, and a semiconductor memory.

In order to distribute the program, for example, removable recording media, such as digital versatile discs (DVDs) and compact disk-read only memories (CD-ROMs), for storing the program are used. Alternatively, the program may be stored in a storage unit of a server computer, and the server computer may transfer the program to other computers.

As described above, according to the present technique, the asynchronous circuit verification method and the asynchronous circuit verification program can detect an asynchronous circuit and abstract the asynchronous circuit as a part by referring the library in a style check phase after logic synthesis is performed. Subsequently, style check items and dynamic check information for each part are output as verification information. As a result, verification of the operation between asynchronous paths can be performed, and therefore, the efficiency of verification of an asynchronous circuit and the accuracy of verification can be improved.

Figure 13:
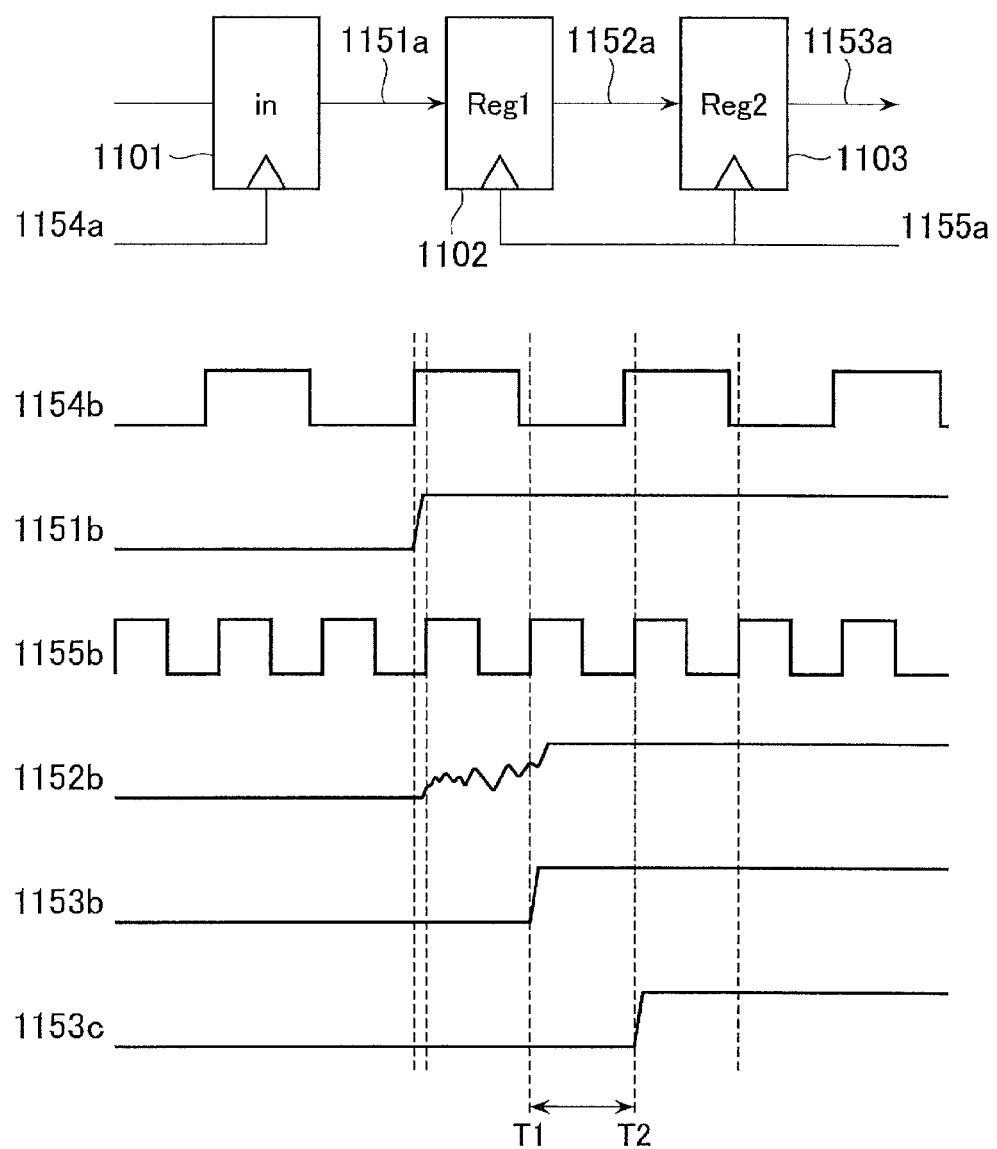
FIG. 13 illustrates a metastable state of an asynchronous circuit.

FIG. 13 illustrates the occurrence of an unstable period of an output signal due to metastability of an asynchronous path. Reference numerals 1101 to 1103 represent registers. Reference numerals 1151a to 1153a represent signals propagating between the registers. Reference numerals 1154a to 1155a represent asynchronous clocks having different cycles and phases. Reference numeral 1154b represents the waveform of the clock 1154a, reference numeral 1151b represents the waveform of the signal 1151a, reference numeral 1155b represents the waveform of the clock 1155a, reference numeral 1152b represents the waveform of the signal 1152a, and reference numerals 1153b and 1153c represent the waveforms that possibly occur in the signal 1153a. As shown by the waveform diagram in FIG. 13, when the rises of the waveforms 1154b and 1155b occur at substantially the same timing point, the output signal 1152a of the register 1102 becomes unstable, as shown by the waveform 1152b. In this case, the timing of the output signal 1153a from the register 1103 may be represented by the waveform 1153b or 1153c depending on whether the register 1103 determines that the output signal 1152a from the register 1102 has a high level at a time T1 or T2.

FIG. 14 illustrates the case where such an asynchronous path causes a problem. Reference numerals 1201 to 1204 represent registers. Reference numeral 1205 represents an AND circuit. Reference numerals 1250a to 1253a represent the output signals of the registers 1201 to 1204, respectively. Reference numerals 1270 and 1271 represent asynchronous circuits. Clocks 1254a and 1255a are asynchronous clocks having different cycles and phases. Reference numeral 1256a represents the output signal of the AND circuit 1205. A waveform 1254b represents the clock 1254a. A waveform 1250b represents the signal 1250a. A waveform 1251b represents the signal 1251a. A waveform 1255b represents the clock 1255a. A waveform 1252b represents the signal 1252a. A waveform 1253b represents the signal 1253a. As a result of metastability, the phase of the output signal 1252a from the register 1202 is shifted from the phase of the output signal 1253a from the register 1204, as in the case of the waveform 1252b and the waveform 1253b. At that time, a pulse 1263 is unintentionally output in a waveform 1256b of an output signal of the AND circuit 1205. The unintended pulse 1263 may cause a circuit to operate incorrectly. If a coupling relationship between asynchronous circuits is unknown, performance of verification is required under the assumption that one asynchronous circuit is related to all of the other asynchronous circuits. This requirement increases the verification time of an asynchronous circuit and decreases the accuracy of the verification.

The present embodiment is applied to circuits shown in FIG. 14. Verification information about asynchronous circuits 1270 and 1271 shown in FIG. 14 is output by referring to the circuit part information thereof. Furthermore, circuit part information in the upper layer is referenced. If matched circuit part information is registered in the library, a relationship between the two asynchronous circuits 1270 and 1271 is output as verification information. More specifically, signals 1250 and 1251 are transferred to the registers 1202 and 1204 operating with a clock 1255a so as to become signals 1252a and 1253a. Accordingly, the CPU 1003 generates, as verification information, coverage information indicating that a period difference between the signals 1252a and 1253a may be one of the following three values: −1, 0, and +1 when the clock 1255a is input.

Figure 15:
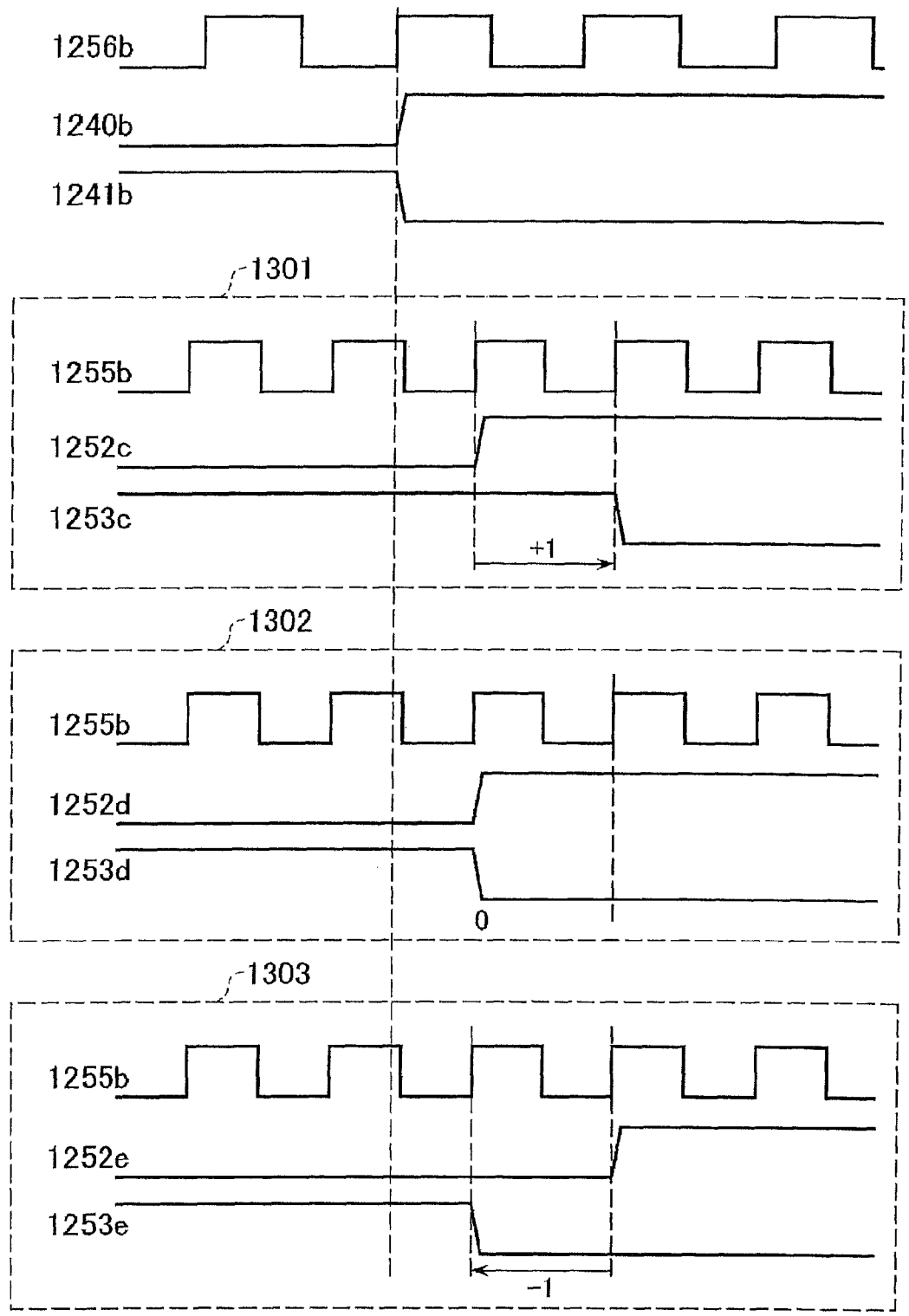
FIG. 15 illustrates a timing shift that is likely to occur in an asynchronous circuit.

FIG. 15 illustrates the above-described three period differences using time-varying waveforms. A time-varying waveform 1301 represents a waveform when the signal 1253a is behind the signal 1252a by one cycle. A time-varying waveform 1302 represents a waveform when the signals 1252a and 1253a have the same timing. A time-varying waveform represents a waveform when the signal 1253a is ahead of the signal 1252a by one cycle.

As described above, by using verification information including signal propagation timing requirements between asynchronous paths for timing verification, the efficiency and the accuracy of verification of a logic circuit including an asynchronous circuit can be improved.

What is claimed is:

1. A method of verifying a circuit for use in an apparatus for verifying a circuit operation indicated by circuit information, the circuit comprising a plurality of logic circuits and at least one connection line between the logic circuits, the method comprising:
   obtaining information of a plurality of asynchronous circuits each comprising a plurality of registers connected with an connection line, the registers being driven by different clocks, from the circuit information;
   determining information of at least one asynchronous circuit of a first type stored in a library storing information of a plurality of types of asynchronous circuits having different circuit configurations respectively, out of the circuit information;
   determining information of at least one asynchronous circuit of a second type stored in the library out of the circuit information;
   extracting information of an asynchronous circuit of a third type including an asynchronous circuit of the first type and an asynchronous circuit of the second type; and
   extracting verification information associated with the information of the asynchronous circuit of the third type, for verifying the circuit.

2. The method of claim 1, wherein the information of the asynchronous circuit of the third type is extracted when the asynchronous circuit of the first type and the asynchronous circuit of the second type are combined so as to generate a new asynchronous circuit.

3. The method of claim 1, wherein the information of the asynchronous circuit of the first type is verified by verification information for a circuit operation indicated by the asynchronous circuit of the first type, and the information of the asynchronous circuit of the second type is verified by verification information for a circuit operation indicated by the asynchronous circuit of the second type.

4. The method of claim 1, wherein the verification information associated with the information of the asynchronous circuit of the third type includes information of at least one combinational circuit connected between the registers, the combinational circuit comprising no registers.

5. The method of claim 1, wherein the verification information associated with the information of the asynchronous circuit of the third type includes assertion information for verifying the asynchronous circuit logically operates in accordance with expected values.

6. The method of claim 1, wherein the verification information of the third type includes coverage information indicating a relationship between the asynchronous circuits.

7. The method of claim 1, wherein the verification information of the third type includes information of style check result on basis of at least one style check item included in the library, the style check item including style requirements of the asynchronous circuit.

8. A non-transitory computer-readable storage medium storing a computer program of verifying a circuit for use in an apparatus for verifying a circuit operation indicated by circuit information, the circuit comprising a plurality of logic circuits and at least one connection line between the logic circuits, the computer program comprising instructions for:
   obtaining information of a plurality of pieces of asynchronous circuits each comprising a plurality of registers connected with an connection line, the registers being driven by different clocks, from the circuit information;
   determining information of at least one asynchronous circuit of a first type stored in a library storing information of a plurality of types of asynchronous circuits having different circuit configurations respectively, out of the circuit information;
   determining information of at least one asynchronous circuit of a second type stored in the library out of the circuit information;
   extracting information of an asynchronous circuit of a third type including an asynchronous circuit of the first type and an asynchronous circuit of the second type; and
   extracting verification information associated with the information of the asynchronous circuit of the third type, for verifying the circuit.

9. The non-transitory computer-readable storage medium of claim 8, wherein the information of the asynchronous circuit of the third type is extracted when the asynchronous circuit of the first type and the asynchronous circuit of the second type are combined so as to generate a new asynchronous circuit.

10. The non-transitory computer-readable storage medium of claim 8, wherein the information of the asynchronous circuit of the first type is verified by verification information for a circuit operation indicated by the asynchronous circuit of the first type, and the information of the asynchronous circuit of the second type is verified by verification information for a circuit operation indicated by the asynchronous circuit of the first type.

11. The non-transitory computer-readable storage medium of claim 8, wherein the verification information associated with the information of the asynchronous circuit of the third type includes information of at least one combinational circuit connected between the registers, the combinational circuit without comprising any registers.

12. The non-transitory computer-readable storage medium of claim 8, wherein the verification information associated with the information of the asynchronous circuit of the third type includes assertion information for verifying the asynchronous circuit logically operates in accordance with expected values.

13. The non-transitory computer-readable storage medium of claim 8, wherein the verification information of the third type includes coverage information indicating a relationship between asynchronous circuits.

14. The non-transitory computer-readable storage medium of claim 8, wherein the verification information of the third type includes information of style check result on basis of at least one style check item included in the library, the style check item including style requirements of the asynchronous circuit.

\* \* \* \* \*

UNITED STATES PATENT AND TRADEMARK OFFICE
CERTIFICATE OF CORRECTION

| | | |
|---|---|---|
| PATENT NO. | : 7,996,802 B2 | |
| APPLICATION NO. | : 12/230387 | |
| DATED | : August 9, 2011 | |
| INVENTOR(S) | : Noriyuki Ikeda et al. | |

It is certified that error appears in the above-identified patent and that said Letters Patent is hereby corrected as shown below:

Column 1, Line 11-12, Delete "which-are" and insert --which are--, therefor.

Signed and Sealed this
Eighteenth Day of October, 2011

David J. Kappos
*Director of the United States Patent and Trademark Office*